(12) United States Patent
Gaudreau et al.

(10) Patent No.: US 12,381,303 B2
(45) Date of Patent: Aug. 5, 2025

(54) DIRECT CAVITY COMBINER (DCC) FOR COMBINING HUNDREDS OF HIGH-POWER TRANSISTORS INTO A TRANSMITTER SYSTEM FOR PROVIDING MEGAWATTS OF POWER

(71) Applicant: Diversified Technologies, Inc., Bedford, MA (US)

(72) Inventors: Marcel Pierre Joseph Gaudreau, Lexington, MA (US); Daniel Sheen, Brighton, MA (US); John Kinross-Wright, Bedford, MA (US); Adam Rodriguez, Arlington, MA (US); Frederick Marvin Niell, III, Tampa, FL (US); Erik G. Johnson, Somerville, MA (US)

(73) Assignee: Diversified Technologies, Inc., Bedford, MA (US)

( * ) Notice: Subject to any disclaimer, the term of this patent is extended or adjusted under 35 U.S.C. 154(b) by 330 days.

(21) Appl. No.: 17/854,121

(22) Filed: Jun. 30, 2022

(65) Prior Publication Data
US 2023/0006325 A1 Jan. 5, 2023

Related U.S. Application Data

(60) Provisional application No. 63/216,583, filed on Jun. 30, 2021.

(51) Int. Cl.
*H01P 5/12* (2006.01)
*H01P 7/06* (2006.01)
(Continued)

(52) U.S. Cl.
CPC .................. *H01P 5/12* (2013.01); *H01P 7/06* (2013.01); *H02J 4/00* (2013.01); *H03F 3/602* (2013.01); *H03F 3/604* (2013.01)

(58) Field of Classification Search
CPC . H01P 5/12; H03F 3/602; H03F 3/604; G21B 1/21; G21B 1/057
(Continued)

(56) References Cited

U.S. PATENT DOCUMENTS

| 4,656,438 A * | 4/1987 | Levinson | H03F 3/602 330/56 |
| 2002/0105383 A1 * | 8/2002 | Cheo | H03F 3/602 333/230 |

(Continued)

OTHER PUBLICATIONS

Written Opinion of the International Searching Authority for International Application No. PCT/US2022/035681, dated Oct. 4, 2022, three (3) Pages.

*Primary Examiner* — Benny T Lee
(74) *Attorney, Agent, or Firm* — Iandiorio Teska & Coleman, LLP

(57) ABSTRACT

A solid-state direct cavity combiner (DCC) transmitter system for providing megawatts of power is featured. The system includes a resonant cavity including at least one high-power output transmission line, hundreds of high-power transistors each generating an amount of RF power input directly into the resonant cavity, and a plurality of modules each including at least one pair of high-power transistors differentially driving a transmission line and a coupling loop. Each said transmission line and coupling loop extends into the resonant cavity to match an impedance of each said high-power transistors of each said module to an impedance of said resonant cavity to electromagnetically couple power into the resonant cavity to provide the megawatts of power to the high-power output transmission line.

62 Claims, 14 Drawing Sheets

(51) Int. Cl.
  *H02J 4/00* (2006.01)
  *H03F 3/60* (2006.01)
(58) Field of Classification Search
  USPC .......................................................... 333/125
  See application file for complete search history.

(56) References Cited

U.S. PATENT DOCUMENTS

| | | |
|---|---|---|
| 2011/0140772 A1 | 6/2011 | Sengupta et al. |
| 2011/0309884 A1 | 12/2011 | Dishop |
| 2018/0331666 A1 | 11/2018 | Johnson et al. |
| 2021/0099143 A1* | 4/2021 | Otake .................... H03F 3/195 |

* cited by examiner

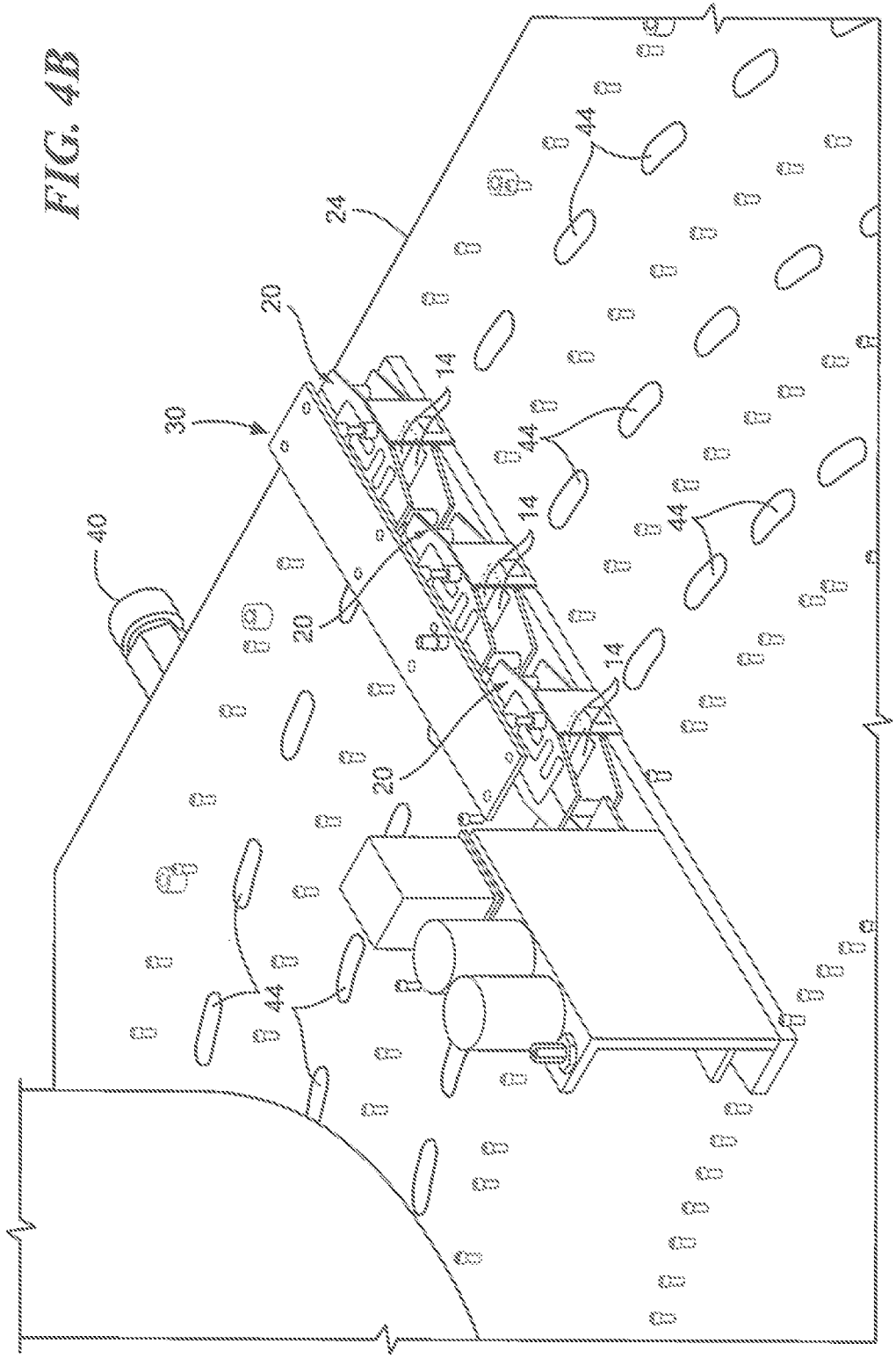

DIRECT CAVITY COMBINER (DCC) FOR COMBINING HUNDREDS OF HIGH-POWER TRANSISTORS INTO A TRANSMITTER SYSTEM FOR PROVIDING MEGAWATTS OF POWER

RELATED APPLICATIONS

This application claims benefit of and priority to U.S. Provisional Application Ser. No. 63/216,583 filed Jun. 30, 2021, under 35 U.S.C. §§ 119, 120, 363, 365, and 37 C.F.R. § 1.55 and § 1.78, which is incorporated herein by this reference.

FIELD OF THE INVENTION

This subject invention relates to a solid-state direct cavity combiner (DCC) transmitter system.

BACKGROUND OF THE INVENTION

A solid-state Direct Cavity Combiner (DCC) transmitter combines the RF output of many RF transistors in a large resonant cavity operating in a range of predetermined frequencies. To date, no one has successfully created a compact, reliable, solid-state DCC transmitter capable of delivering megawatts of heating power at RF frequencies into either present experimental or future commercial nuclear fusion power plants.

Conventional RF power technology to provide such high-power at RF frequencies for nuclear fusion includes vacuum tubes and modular solid-state amplifiers. Both of these technologies may fail to deliver the needed power at RF frequencies for different reasons.

One conventional approach to delivering RF power needed for plasma heating relies on high-power vacuum tubes (tetrodes). Vacuum electronic devices may fail because of inherent tube characteristics and vanishing marketplace issues, such as tuning, stability, lifetime, unreliable supply chain and the like. The large tetrodes or vacuum tubes are in serious risk of being abandoned by industry as the techniques required to build them are lost through retirement of the key engineers and technicians.

Another conventional approach to delivering RF power needed for plasma heating is modular solid-state amplifiers which use multi-stage power combination (which may or may not include binary combining) to combine the output of many individual transistor amplifiers. Modular solid-state amplifiers may fail due to electrical and RF control difficulties (generation and combination of a distributed system), mechanical complexity, and a very large footprint. While conventional solid-state transmitters have been demonstrated at hundreds of kilowatts, state-of-the-art conventional high-power transmitters remain excessively large and complex. The leading manufacturer of such devices has indicated they would not repeat the current approach of combining many 100 kW units.

SUMMARY OF THE INVENTION

In one aspect, a solid-state direct cavity combiner (DCC) transmitter system for providing megawatts of power is featured. The system includes a resonant cavity including at least one high-power output transmission line, hundreds of high-power transistors each generating an amount of power input directly into the resonant cavity, and a plurality of modules each including at least one pair of high-power transistors differentially driving a transmission line and a coupling loop. Each transmission line and coupling loop extends into the resonant cavity to match an impedance of each high-power transistor of each module to an impedance of the resonant cavity to electromagnetically couple power into the resonant cavity to provide the megawatts of power to the high-power output transmission line.

In one embodiment, the megawatts of power may be in the range of about 1 MW to about 3 MW. Each module includes the transmission line, the coupling loop, and at least one pair of high-power transistors. The at least one pair of high-power transistors may be symmetrically opposed to provide differential inputs to the transmission line. Each module may include two pairs of high-power transistors packaged as a quad module. Each pair of high-power transistors may be symmetrically opposed to provide differential inputs to each transmission line. The plurality of modules may be positioned on the resonant cavity to maximize packing density of the high-power transistors. The plurality of modules may be positioned at different radii on the end-plate on the resonant cavity. Three quad modules may be packaged as a tri-quad module. Each quad module may be positioned at a different radii on the end-plate. The tri-quad modules may be positioned on the resonant cavity to maximize packing density of the high-power transistors. Each tri-quad module may include a power converter to efficiently power the high-power transistors from a single high voltage input. The resonant cavity may include at least one liquid cooled cavity end-plate including a plurality of coolant channels. The resonant cavity may include a plurality of concentric rings of slots disposed through an end-plate. Each transmission line and coupling loop of each module may extend through one slot of the plurality of concentric rings of slots. A predetermined number of the plurality of modules may be positioned proximate one or more concentric rings about the cavity end-plate. The plurality of quad modules may be positioned proximate one or more concentric rings about the cavity end-plate. The plurality of tri-quad modules may be positioned equally spaced along the concentric rings about the cavity end-plate. The megawatts of power may be used for plasma heating in a fusion reactor. The plurality of modules may include an electrostatic shield mounted to an interior of the resonant cavity to shield each magnetic coupling loop from an axial electric field. The plurality of modules may include an overvoltage protection circuit configured to prevent damage to the high-power transistors in the event of an overload.

In another aspect, a solid-state direct cavity combiner (DCC) transmitter system for providing megawatts of power is featured. The system includes a resonant cavity including at least one high-power output transmission line, hundreds of high-power transistors each generating an amount of power input directly into the resonant cavity, and a plurality of modules each including a plurality of high-power transistors, a transmission line and a coupling loop. The plurality of modules is positioned at multiple different radii on an end-plate on the resonant cavity to maximize packing density of the high-power transistors. Each transmission line and coupling loop extends into the resonant cavity to match an impedance of each high-power transistor of each module to an impedance of the resonant cavity to electromagnetically couple power into the resonant cavity to provide the megawatts of power to the high-power output transmission line.

In one embodiment, the megawatts of power may be in the range of about 1 MW to about 3 MW. Each module may include the transmission line, the coupling loop, and at least one pair of transistors. The pair of high-power transistors may be symmetrically opposed to provide differential inputs to the transmission line. Each module may include two pairs of high-power transistors packaged as a quad module. Each pair of high-power transistors may be symmetrically opposed to provide differential inputs to each transmission line. The plurality of modules may be positioned on the resonant cavity to maximize packing density of the high-power transistors. The plurality of modules may be packaged at different radii on the end-plate on the resonant cavity. Three quad modules may be packaged as a tri-quad module. Each quad module may be positioned at a different radii on the end-plate. Each of the tri-quad modules may be positioned on the resonant cavity to maximize packing density of the high-power transistors. Each tri-quad module may include a power converter to efficiently power the high-power transistors from a single high voltage input. The resonant cavity may include at least one liquid cooled cavity end-plate including a plurality of coolant channels. The resonant cavity may include a plurality of concentric rings of slots disposed through an end-plate. Each transmission line and coupling loop of each module may extend through one slot of the plurality of concentric rings of slots. A predetermined number of the plurality of modules may be positioned proximate one or more concentric rings about the cavity end-plate. A plurality of quad modules may be positioned proximate one or more concentric rings about the cavity end-plate. A plurality of tri-quad modules may be positioned equally spaced along the concentric rings about the cavity end-plate. The at least one fusion device may include a fusion reactor. The each of the plurality of modules may include an electrostatic shield mounted to an interior of the resonant cavity to shield each magnetic coupling loop from an axial electric field. The plurality of modules may include an overvoltage protection circuit configured to prevent damage to the high-power transistors in the event of an overload.

In another aspect, a solid-state direct cavity combiner (DCC) transmitter system for providing megawatts of power is featured. The system includes a resonant cavity including at least one high-power output transmission line, hundreds of high-power transistors each generating an amount of power input directly into the resonant cavity, and a plurality of modules each including at least one pair of high-power transistors differentially driving a transmission line and a coupling loop. The plurality of modules positioned at multiple different radii on an end-plate on the resonant cavity to maximize packing density of the high-power transistors. Each transmission line and coupling loop extend into the resonant cavity to match an impedance of each high-power transistor of each module to an impedance of the resonant cavity to electromagnetically couple power into the resonant cavity to provide the megawatts of power to the high-power output transmission line.

In one embodiment, the megawatts of power may be in the range of about 1 MW to about 3 MW. Each module may include the transmission line, the coupling loop, and at least one pair of transistors packaged as a module. The pair of high-power transistors may be symmetrically opposed to provide differential inputs to the transmission line. Each module may include two pair power transistors packaged as a quad module. Each pair of high-power transistors may be symmetrically opposed to provide differential inputs to each transmission line. The plurality of modules may be positioned on the resonant cavity to maximize packing density of the high-power transistors. The plurality of modules may be packaged at different radii on the end-plate on the resonant cavity. Three quad modules may be packaged as a tri-quad module. Each quad module may be positioned at a different radii on the end-plate. Each of the tri-quad modules may be positioned on the resonant cavity to maximize packing density of the high-power transistors. Each tri-quad module may include a power converter to efficiently power the high-power transistors from a single high voltage input. The resonant cavity may include at least one liquid cooled cavity end-plate including a plurality of coolant channels. The resonant cavity may include a plurality of concentric rings of slots disposed through an end-plate. Each transmission line and coupling loop of each module may extend through one slot of the plurality of concentric rings of slots. A predetermined number of the plurality of modules may be positioned proximate one or more concentric rings about the cavity end-plate. The plurality of quad modules may be positioned proximate one or more concentric rings about the cavity end-plate. The plurality of tri-quad modules may be positioned equally spaced along the concentric rings about the cavity end-plate. The at least one fusion device may include a fusion reactor. The plurality of modules may include an electrostatic shield mounted to an interior of the resonant cavity to shield each magnetic coupling loop from an axial electric field. The plurality of modules may include an overvoltage protection circuit configured to prevent damage to the high-power transistors in the event of an overload.

In another aspect, a method for providing megawatts of power with a solid-state direct cavity combiner (DCC) transmitter is featured. The method includes providing a resonant cavity including at least one high-power output transmission line, providing hundreds of high-power transistors each generating an amount of power input directly into the resonant cavity, and providing a plurality of modules each including at least one pair of high-power transistors differentially driving a transmission line and a coupling loop. The method also includes extending each transmission line and coupling loop into the resonant cavity to match an impedance of each high-power transistor of each module to an impedance of the resonant cavity to electromagnetically couple power into the resonant cavity to provide the megawatts of power to the high-power output transmission line.

In another aspect, a method for providing megawatts of power with a solid-state direct cavity combiner (DCC) transmitter is featured. The method includes providing a resonant cavity including at least one high-power output transmission line, providing hundreds of high-power transistors each generating an amount of power input directly into the resonant cavity, and providing a plurality of modules each including a plurality of high-power transistors, a transmission line and a coupling loop. The method also includes placing the plurality of modules at multiple different radii on an end-plate on the resonant cavity to maximize packing density of the high-power transistors. Extending each transmission line and coupling loop into the resonant cavity to match an impedance of each high-power transistor of each module to an impedance of the resonant cavity to electromagnetically couple power into the resonant cavity to provide the megawatts of power to the high-power output transmission line.

In another aspect, a method for providing megawatts of power with a solid-state direct cavity combiner (DCC) transmitter is featured. The method includes providing a resonant cavity including at least one high-power output transmission line, providing hundreds of high-power transistors each generating an amount of power input directly into the resonant cavity, and providing a plurality of modules each including at least one pair of high-power transistors differentially driving transmission line and a coupling loop.

The method also includes placing the plurality of modules at multiple different radii on an end-plate on the resonant cavity to maximize packing density of the high-power transistors, and extending each transmission line and coupling loop into the resonant cavity to match an impedance of each high-power transistor of each module to an impedance of the resonant cavity to electromagnetically couple power into the resonant cavity to provide the megawatts of power to the high-power output transmission line.

The subject invention, however, in other embodiments, need not achieve all these objectives and the claims hereof should not be limited to structures or methods capable of achieving these objectives.

BRIEF DESCRIPTION OF THE SEVERAL VIEWS OF THE DRAWINGS

Other objects, features and advantages will occur to those skilled in the art from the following description of a preferred embodiment and the accompanying drawings, where like features are denoted by the same reference label throughout the detail description of the drawings, and in which:

FIG. 4B shows an example of a tri-quad module shown in one or more of FIGS. 1, 2, 3A, 3B, and 4A inserted into concentric ring slots in the end-plate;

DETAILED DESCRIPTION OF THE INVENTION

Figure 1:
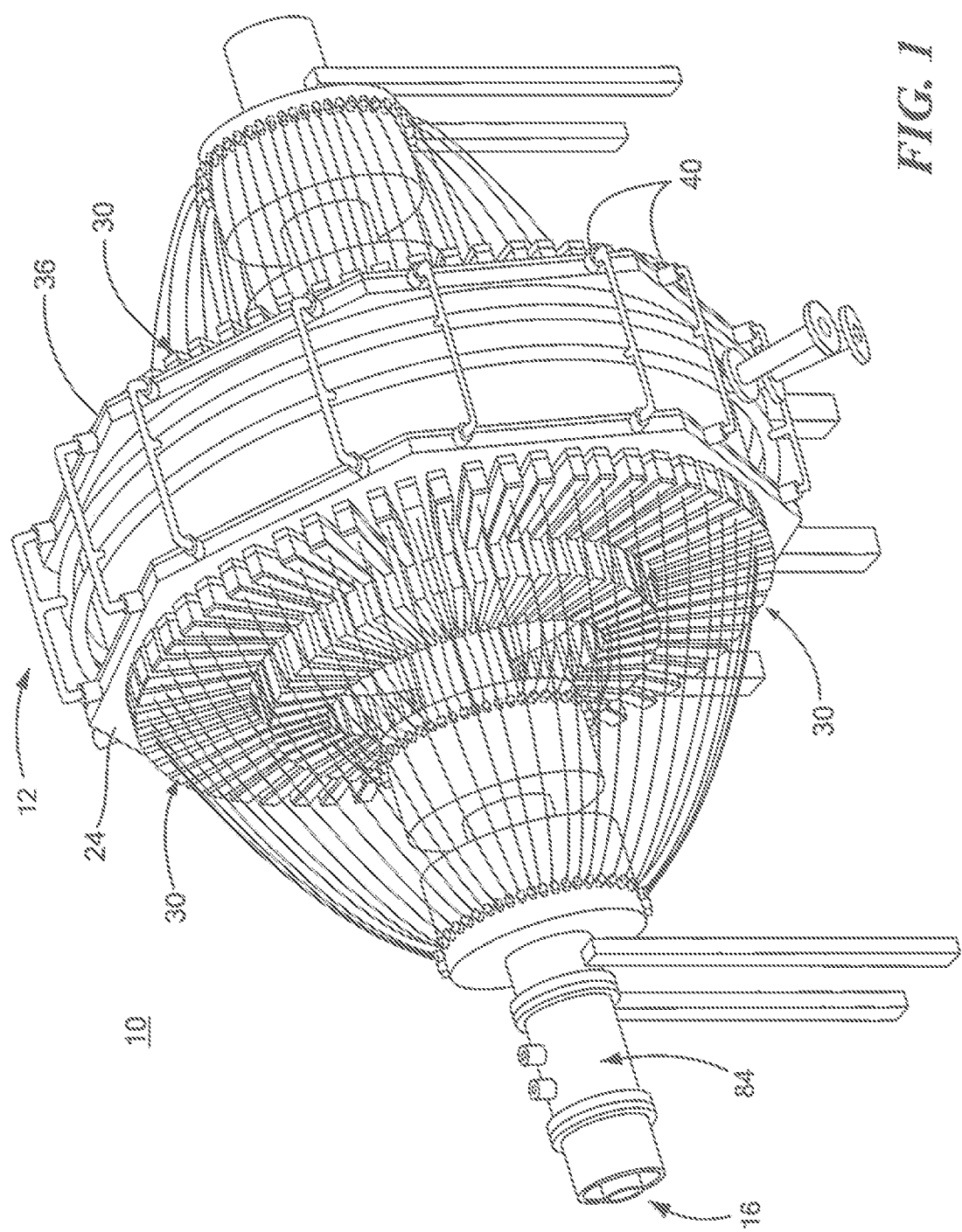
FIG. 1 is a diagram showing the primary components of one example of the solid-state direct cavity combiner (DCC) transmitter system for providing megawatts of power.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1, one embodiment of solid-state Direct Cavity Combiner (DCC) transmitter system 10. Solid-state DCC transmitter system 10 preferably provides megawatts of heating power at predetermined frequencies, including Ion Cyclotron Range of Frequencies (ICRF), and the like, into a demonstration or commercial fusion power plant. Solid-state DCC transmitter system 10 preferably provides a reliable, affordable, and versatile steady-state plasma heating source for commercial fusion generators and other technologies. The RF technology of solid-state DCC transmitter system 10 for plasma heating may apply to a wide range of fusion devices, including steady-state tokamaks and other devices.

In one example, solid-state DCC transmitter system 10 is preferably a 120 MHz to 180 MHz 1.3 MW solid state Direct Cavity Combiner (DCC) transmitter as shown. Solid-state DCC transmitter system 10 includes large resonant cavity 12. In one design, resonant cavity 12 may be about 6 feet in diameter. In other examples, resonant cavity 12 may be smaller or larger than 6 feet in diameter, e.g., from about 6 inches to 105 inches in diameter or similar type size. As will be discussed in detail below, solid-state DCC transmitter system 10 includes numerous high-power RF transistors and combines the RF output of the high-power RF transistors in large resonant cavity 12, preferably operating at about 120 MHz or similar high frequencies. Solid-state DCC transmitter system 10 preferably combines numerous high-power RF transistors into a single resonant cavity 12 using the subject matter disclosed in U.S. Pat. No. 10,411,665 for a Resonant Cavity Combined Solid State Amplifier System by the applicant hereof, incorporated by reference herein. In one design, solid-state DCC transmitter system 10 may combine hundreds of high-power RF transistors into resonant cavity 12. In other designs, Solid-state DCC transmitter system 10 may combine more or less than hundreds of high-power RF transistors into resonant cavity 12. Resonant cavity 12 may operate at higher or lower frequencies than 120 MHZ, e.g., at frequencies in the range of about 30 MHz to about 2,400 MHz.

Solid-state DCC transmitter system 10 of one or more embodiments of this invention addresses the modular amplifier problem with an integrated resonant cavity 12 and hundreds of individual high-power RF transistors preferably arranged in ordered ranks, e.g., three concentric rows of quad modules, as discussed below. Each transistor module is preferably stabilized by innovative feedback control circuitry monitoring the drain voltage of each device and protecting the high-power RF transistors from damage in case of overload. Adjusting the feedback parameters of solid-state DCC transmitter system 10 preferably suppresses parasitic effects when solid-state DCC transmitter system 10 is scaled-up by a factor of 100, e.g., from about 10 kW to about 1000 kW. Solid-state DCC transmission system 10 includes resonant cavity 12, FIG. 1, discussed above which includes at least one high-power transmission line output, e.g., high-power transmission line 16, FIG. 2. Resonant cavity 12 is preferably configured to provide variable tuning and loading. System 10 also includes hundreds of high-power transistors, where each high-power transistor generates an amount of power in the range from 600 W to 1000 W which is input directly into resonant cavity 12. FIGS. 3A, 3B, and 4B show examples of a few high-power transistors 14 configured to provide RF power to resonant cavity 12, discussed in detail below.

System 10 also includes a plurality of modules 20 which each include at least one pair of high-power RF transistors 14, transmission line 26, and coupling loop 28, preferably packed as module 20 as shown. In one design, each of the plurality of modules 20 preferably include two pairs of high-power transistors 14. In other realizations, any integer number of pairs 22 may be combined in parallel in a module 20. FIG. 3B shows an example module 20 with two pairs (four) high-power transistors 14, where each symmetric pair of high-power transistors 14 is indicated by 22. Each pair 22, FIG. 3B of high-power transistors 14, FIGS. 3A-3B, differentially drives transmission line 26 and coupling loop 28. Each transmission line 26 and coupling loop 28 extend into resonant cavity 12, FIGS. 1, 2, and 3A, as shown to match an impedance of each high-power transistor 14 of each module 20 to an impedance of resonant cavity 12 to electromagnetically couple power into resonant cavity 12 to provide megawatts of power to high-power output transmission line 16.

Each module 20 with two pairs of high-power transistor 14 is disclosed herein as quad module 20, e.g., four high-power transistor 14. In one example, three quad modules 20 are preferably packed together in groups of three as tri-quad module 30 as shown in FIG. 3A and indicated in FIGS. 1 and 2.

Figure 7:
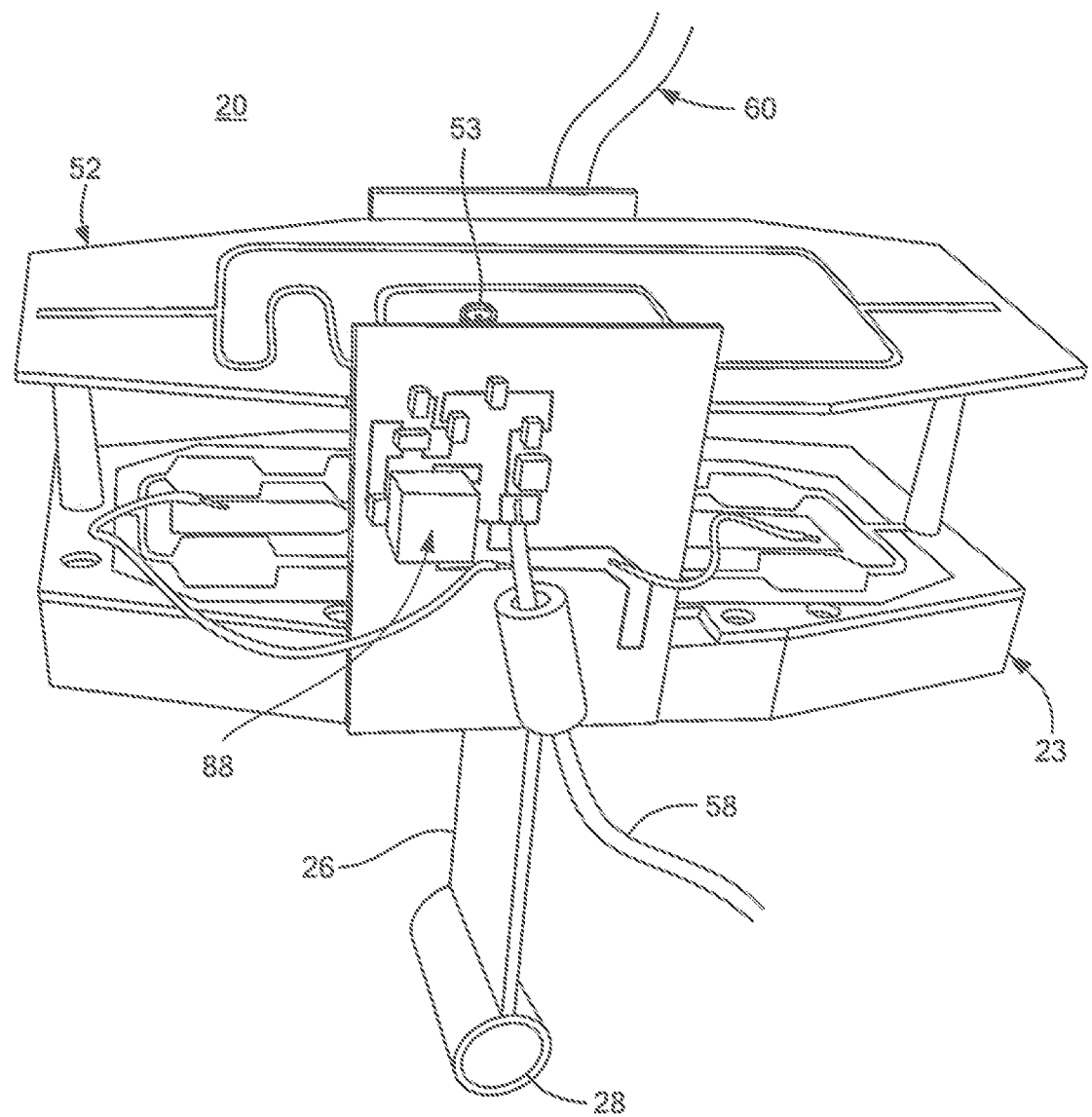
FIG. 7 shows an example of a prototype of a quad module shown in one or more of FIGS. 1, 2, 3A, 3B, 4A, 4B, 5 and 6.

Each module 20 preferably includes an overvoltage protection circuit 88, FIGS. 3A and 7 which preferably prevents damage to high-power transistors 14 in the event of an overload. Overvoltage protection circuit 88 is preferably configured as a feedback control circuit which monitors the drain voltage of each module 20 to protect high-power RF transistors 14 from damage in the event of an overload.

The pair of high-power transistors 14 are preferably symmetrically opposed, e.g., as shown in FIGS. 3A and 3B, to provide differential inputs to transmission line 26.

Figure 2:
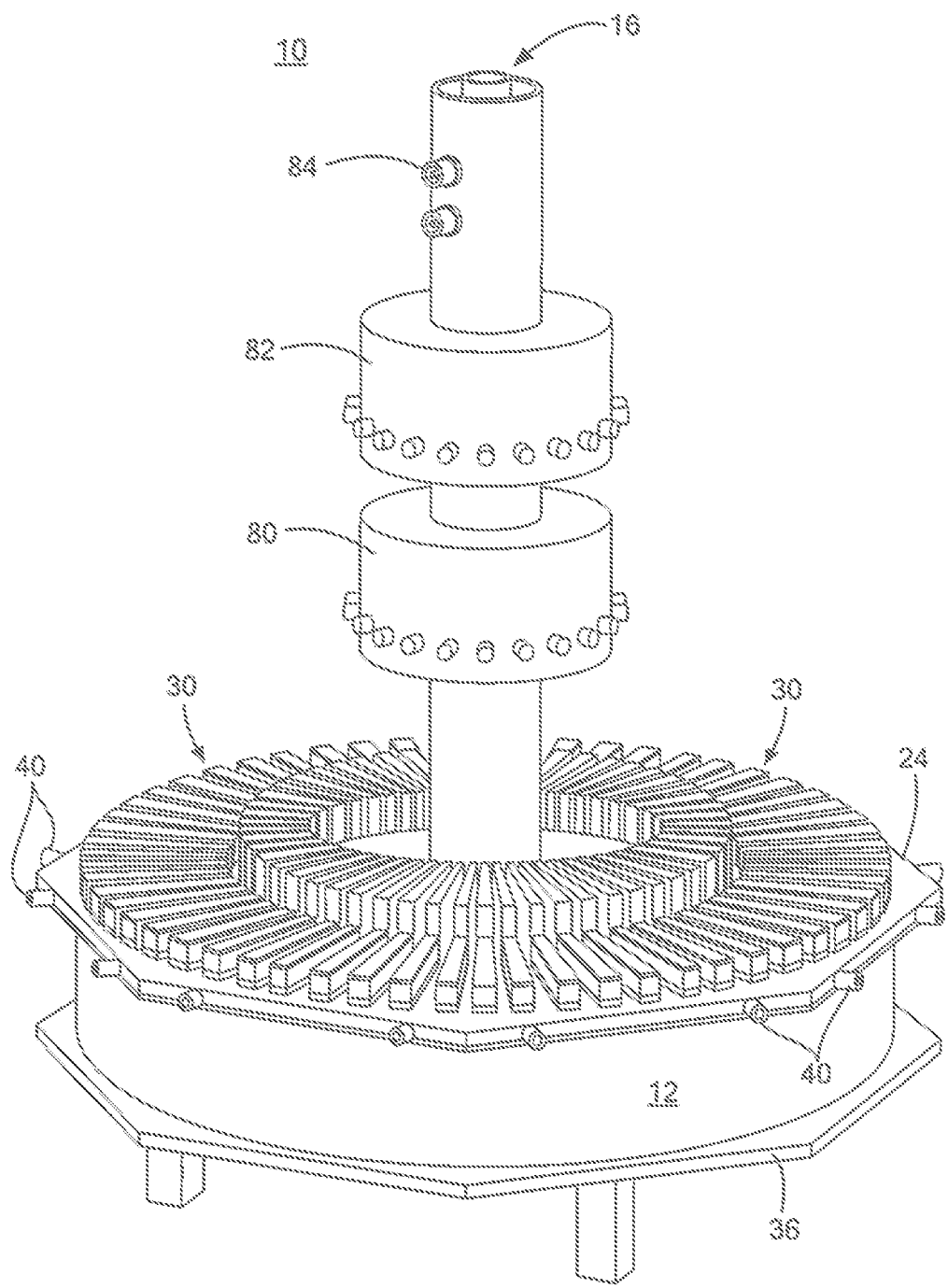
FIG. 2 is a diagram showing in further detail the primary components of the solid-state DCC transmitter system shown in FIG. 1.
Figure 3A:
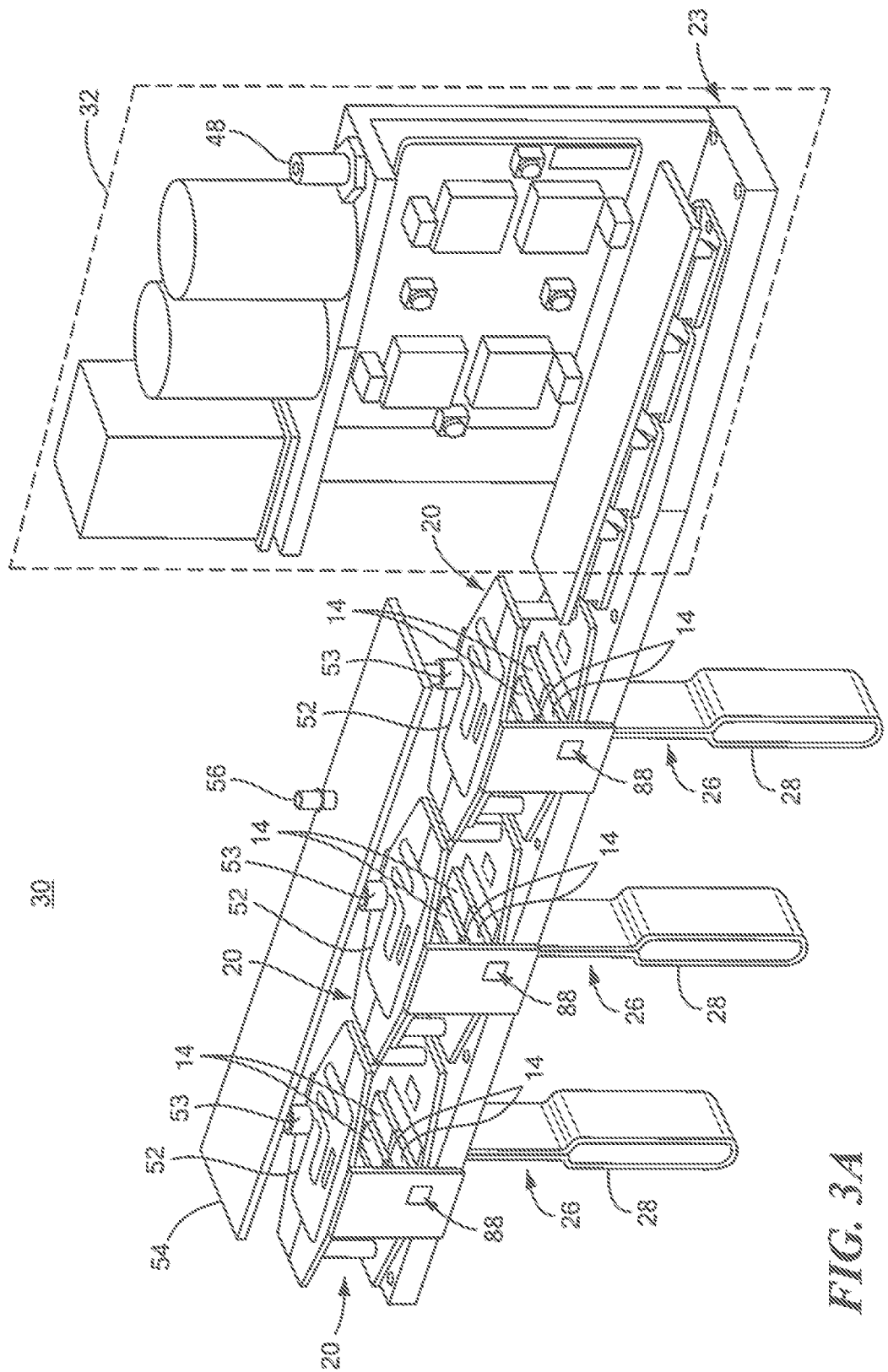
FIG. 3A is a diagram showing in further detail one example of a tri-quad module shown in FIGS. 1 and 2.
Figure 3B:
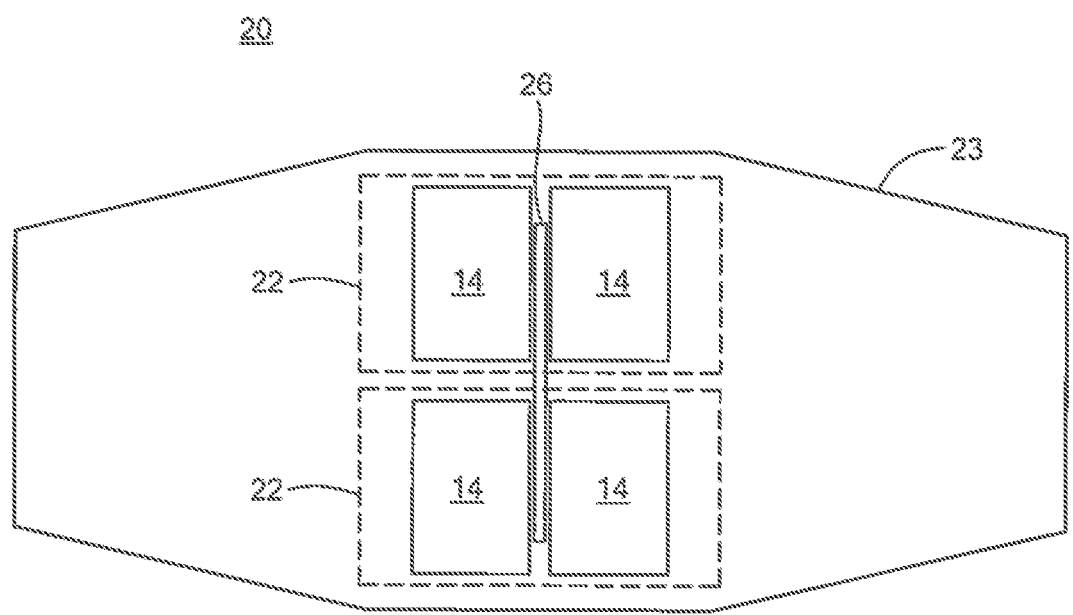
FIG. 3B is a diagram showing in further detail one example of the arrangement of two pairs of high-power transistors as a quad-module shown in FIG. 3A.

In one design, the plurality of modules 20, preferably as tri-quad modules 30, FIGS. 1, 2, and 3A are preferably positioned on resonant cavity 12 to maximize packing density of the high-power transistors 14, e.g., as shown in one or more of FIGS. 1, 2, 3A and 3B.

Figure 4A:
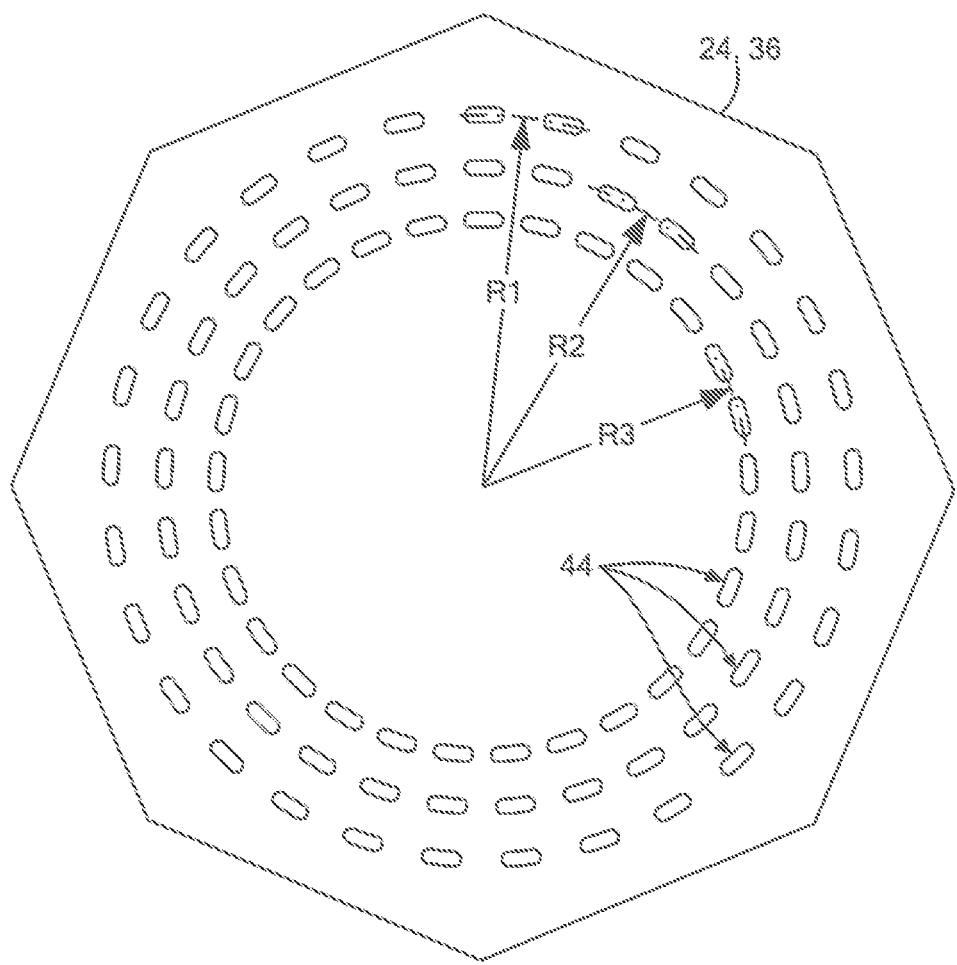
FIG. 4A shows examples of concentric ring slots located at different radii of an end-plate of the resonant cavity shown in one or more of FIGS. 1, 2, 3A and 3B.
Figure 5:
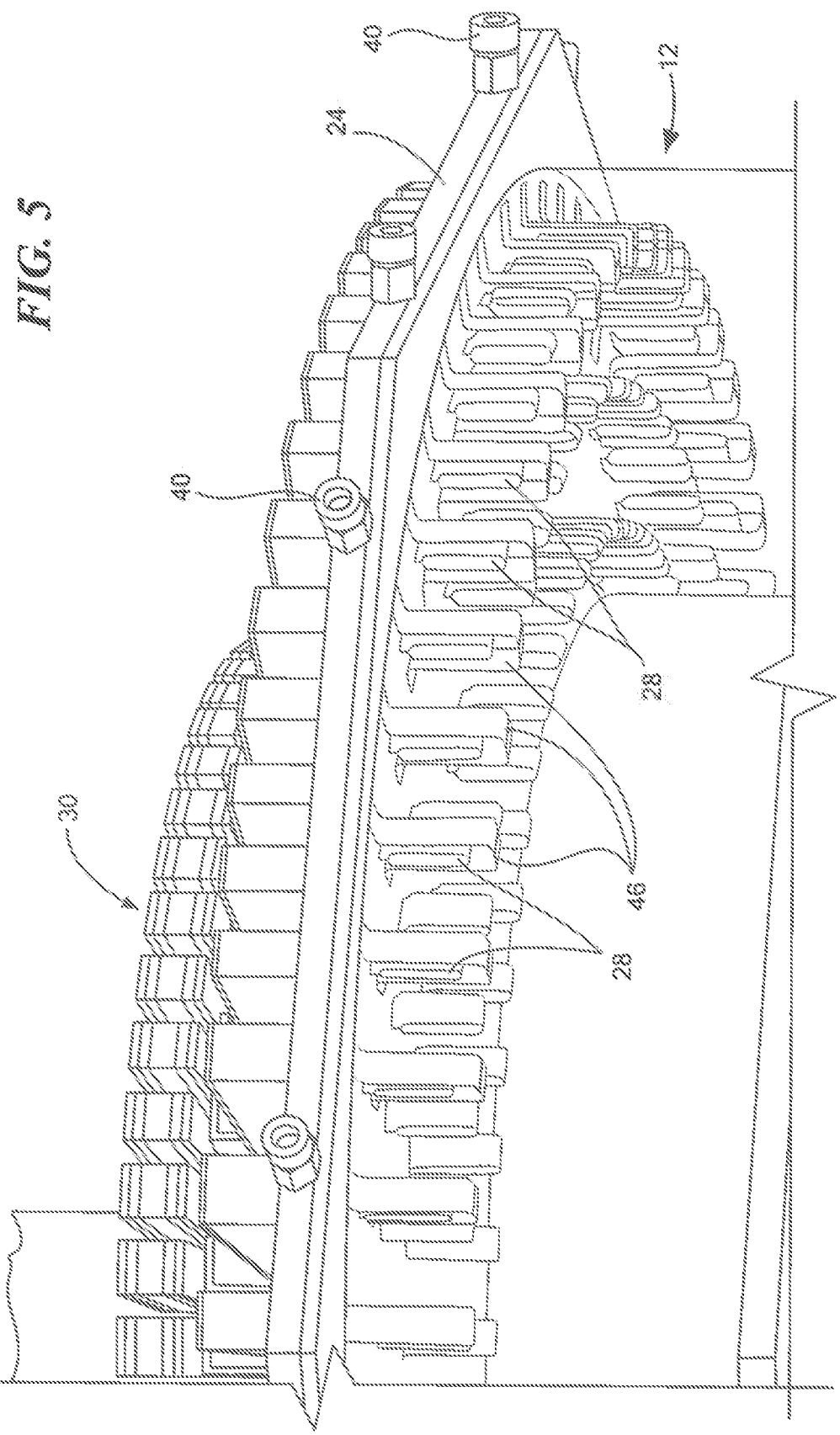
FIG. 5 is an interior view of the resonant cavity shown in one or more of FIGS. 1, 2, 3A, 3B, 4A, and 4B showing an example of several tri-quad modules with their respective transmission line and magnetic coupling loop extending through concentric ring slots shown in FIGS. 4A-4B.

Multiple quad modules 20, e.g., tri-quad modules 30, are preferably positioned at different radii on end-plate 24 of resonant cavity 12, e.g., radii $R_1$, $R_2$, $R_3$, FIG. 4A. At least one end-plate, e.g., end-plate 24, FIGS. 1-2, of resonant cavity 12, preferably includes a plurality of concentric ring slots 44, FIG. 4A, shown in greater detail in FIG. 4B, which extend though end-plate 24 as shown. In one design, each transmission line 26, FIG. 3A, and each magnetic coupling loop 28 of each module 20 extends through one of the concentric ring slots 44, e.g., as shown in FIGS. 4A, 4B and 5.

Preferably, a plurality of modules 20, e.g., tri-quad modules 30, are positioned equally along concentric rings 44 about end-plate 24, e.g., as shown in FIG. 2. A plurality of modules 20, preferably packed as tri-quad modules 30, are preferably positioned proximate to one or more concentric rings 44 about end-plate 24 as shown. Such a design maximizes packing and power density of high-power transistors 14.

Resonant cavity 12 preferably includes at least one liquid-cooled end-plate, e.g., end-plate 24, FIGS. 1, 2, 4A, 4B, and 5 discussed above and opposing end-plate 36. End-plate 24 preferably includes embedded water-cooling channels, exemplarily indicated at 40, FIG. 4B, which receives a cooling liquid for direct heat removal from high-power transistors 14. In one example, each of end-plates 24, 36, FIG. 4A, is preferably a sandwich of two copper plates with a labyrinth of water-cooling passages in between. The cooled end-plates, e.g., end-plate 24 shown in greater detail in FIG. 5, preferably cool a majority of the high-power RF transistors 14 of each quad module 20 of each tri-quad module 30 as shown with a single cooled liquid input and output port 40. This design allows quad modules 20 to have only three connections each (drain power 60, FIGS. 6-7, gate bias voltage 58 and RF input connection 53) to operate. Only two connections may be needed if transistor bias voltage is derived locally from the drain power. Solid-state DCC transmitter system 10 of one or more embodiments of this invention preferably requires minimal ancillary equipment beyond an RF driver module and power supplies.

Cooling may be provided by a single input, single output water connection via cooling ports 40 for the entire 1.3 MW resonant cavity 12, FIGS. 1 and 2.

In one example, the frequency of system 10 is in the range of about 60 MHz to about 180 MHz. System 10 also preferably provides megawatts of power preferably in the range of about 1 MW to about 3 MW. In one example, the megawatts of power provided to high-power transmission line 16, FIGS. 1-2, may be used to heat the plasma in a fusion reactor.

In one example, each of the plurality of quad modules 20 preferably includes an electrostatic shield e.g., electrostatic shield 46, FIG. 5 mounted to an interior resonant cavity 12 to shield each magnetic coupling loop 28 from an axial field.

In one design, solid-state DCC transmitter system 10 shown in one or more of FIGS. 1-9 preferably combines four high-power RF transistors 14 as discussed above e.g., 900 W LDMOS transistors, or similar type transistors, into module 20 (Quad). Each quad module 20 is preferably installed at different radii of cooled end-plates 24 and 36 of resonant cavity 12 as discussed above to preferably provide for increased power density and low-cost, modular manufacturing. In one design, each tri-quad module 30 preferably combines a single 600 VDC-to-50 VDC power supply, e.g., power supply 32, FIG. 3A, with three quad modules. Power supply 32 preferably includes a single 600 VDC input terminal 48 and 600 VDC to 50 VDC down converter, to provide up to 13.5 kW of DC power to the quad modules 20, producing 10.8 kW of RF power input to the solid-state DCC transmitter system 10. Power supply 32 preferably provides a constant regulated drain supply. Input DC current is preferably less than about 25 A.

In one example, Solid-state DCC transmitter system 10, FIG. 2, preferably includes DC distribution subsystem 80, RF drive distribution subsystem 82, directional coupler subsystem 84, FIGS. 1 and 2, and high-power transmission line 16, in this example a 9-inch coaxial output cable.

Figure 6:
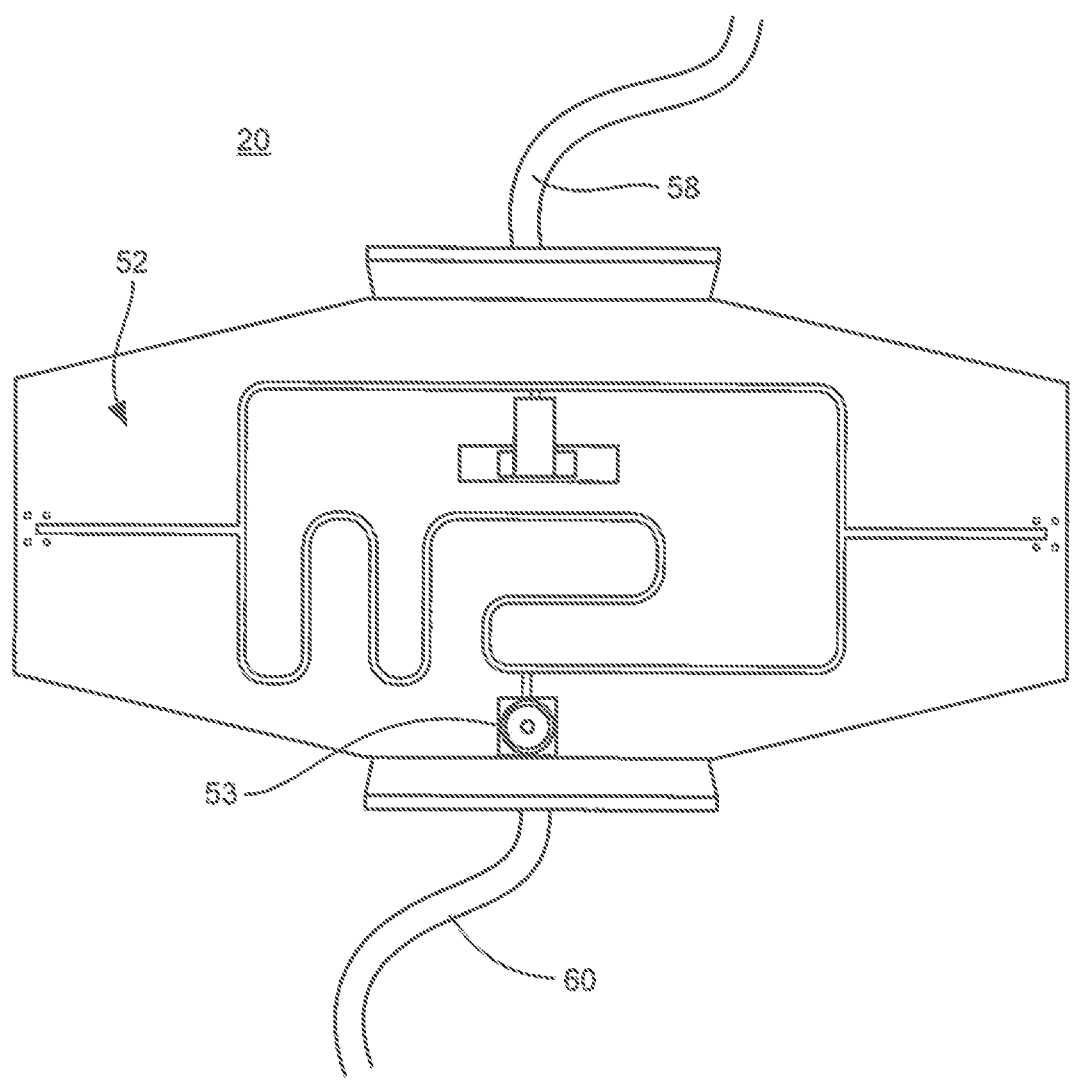
FIG. 6 shows an example of a prototype of a quad module shown in one or more of FIGS. 1, 2, 3A, 3B, 4A, 4B and 5.

Each quad module 20, FIG. 3A, preferably includes two-way RF power splitter 52, including RF input connection 53 as shown, to provide RF drive to the high-power transistors 14. Each tri-quad module 30 preferably includes 3-way splitter 54 and RF driver or input connection 56 as shown. FIGS. 6-7 show an example of a prototype quad module 20 with two-way splitter 52 including RF input connection 53. The transistor gate bias is supplied by wire 58 and the drain power input is supplied by wire 60. The low output impedance of each high-power RF transistor 14 of each quad module 20 is preferably directly connected to magnetic loop (discussed below) installed inside the resonant cavity 12. There are no impedance-matching transformers, circulators, cables or connectors required.

The four high-power RF transistors 14, e.g., as shown in FIGS. 3A-3B, of each quad module 20 of each tri-quad module 30 are preferably mounted on a heat-spreader 23 mounted directly to cavity end-plate 24 and/or end-plate 36 as shown in one or more of FIGS. 1, 2, 3A, 3B, 4A, 4B, 5 and 6. Heat spreader 23 is preferably a thin plate of thermally and electrically conductive material (e.g., copper) which provides structural support for quad module 20 and tri-quad module 30. As discussed above, each quad module 20, preferably includes magnetic coupling loop 28 extending into resonant cavity 12 via short transmission lines 26. Magnetic coupling loop 28 preferably couples RF power to the azimuthal magnetic field of resonant cavity 12. In this example, each tri-quad module 30 preferably includes three magnetic coupling loops 28, e.g., as shown in FIG. 3A. Each magnetic coupling loop 28 is preferably driven in push-pull by the four-high-power RF transistors 14, e.g., 900 W LDMOS RF transistors, or similar type high-power RF transistors for a total of 3.6 kW per coupling loop, or 10.8 kW per tri-quad module 30. Each coupling loop 28 and transmission line 26 on tri-quad module 30 may be optimized for operation in the cavity magnetic field at its radial position to maximize operating efficiency.

Solid-state DCC transmitter system 10 may also preferably include electrostatic shield, exemplarily indicated at 46, FIG. 5, mounted to the interior of resonant cavity 12 as shown which preferably shields magnetic coupling loop 28 from the axial electric field within the cavity.

Figure 8:
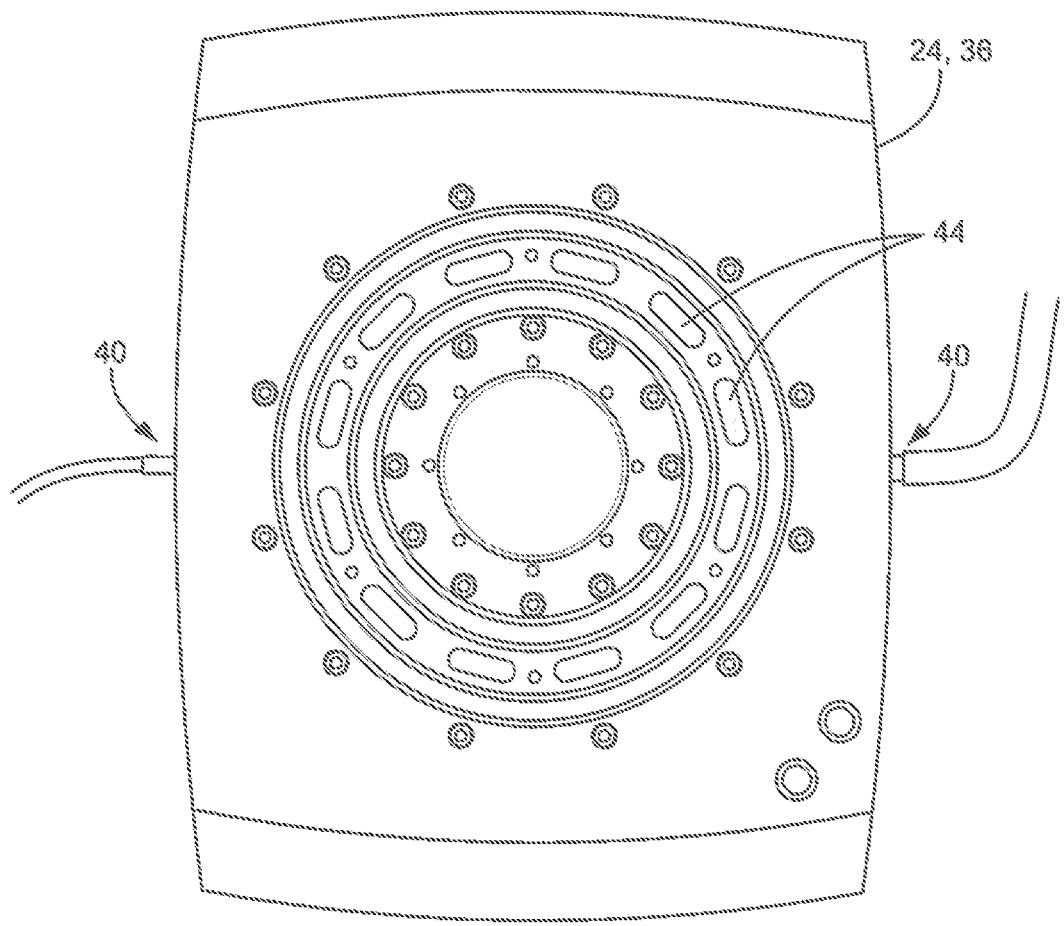
FIG. 8 shows an example of the end-plate shown in one or more of FIGS. 1, 2, 3A, 3B, 4A, 4B, 5, 6, and 7 undergoing cooling water flow-testing.

FIG. 7 shows an example of a prototype of a quad module 20 with four high-power RF transistors 14, and transmission line 26 and magnetic coupling loop 28 which extend into resonant cavity 12. FIG. 8 shows an example of end-plate 24 shown in one or more of FIGS. 1, 2, 3A, 3B, 4A, 4B, 5, 6 and 7 undergoing cooling water flow-testing. In this test, a dye is introduced into the channel (with plexiglass covering) for visualization as shown. In this example, at 650 MHz, a 14" (0.35 m) diameter resonant cavity 12 supports quad modules 20 as shown. At a frequency of 120 MHz ICRF, a 75" (1.9 m) diameter resonant cavity 12 will support about 180 quad modules per side arranged in 3 concentric rings.

Figure 9:
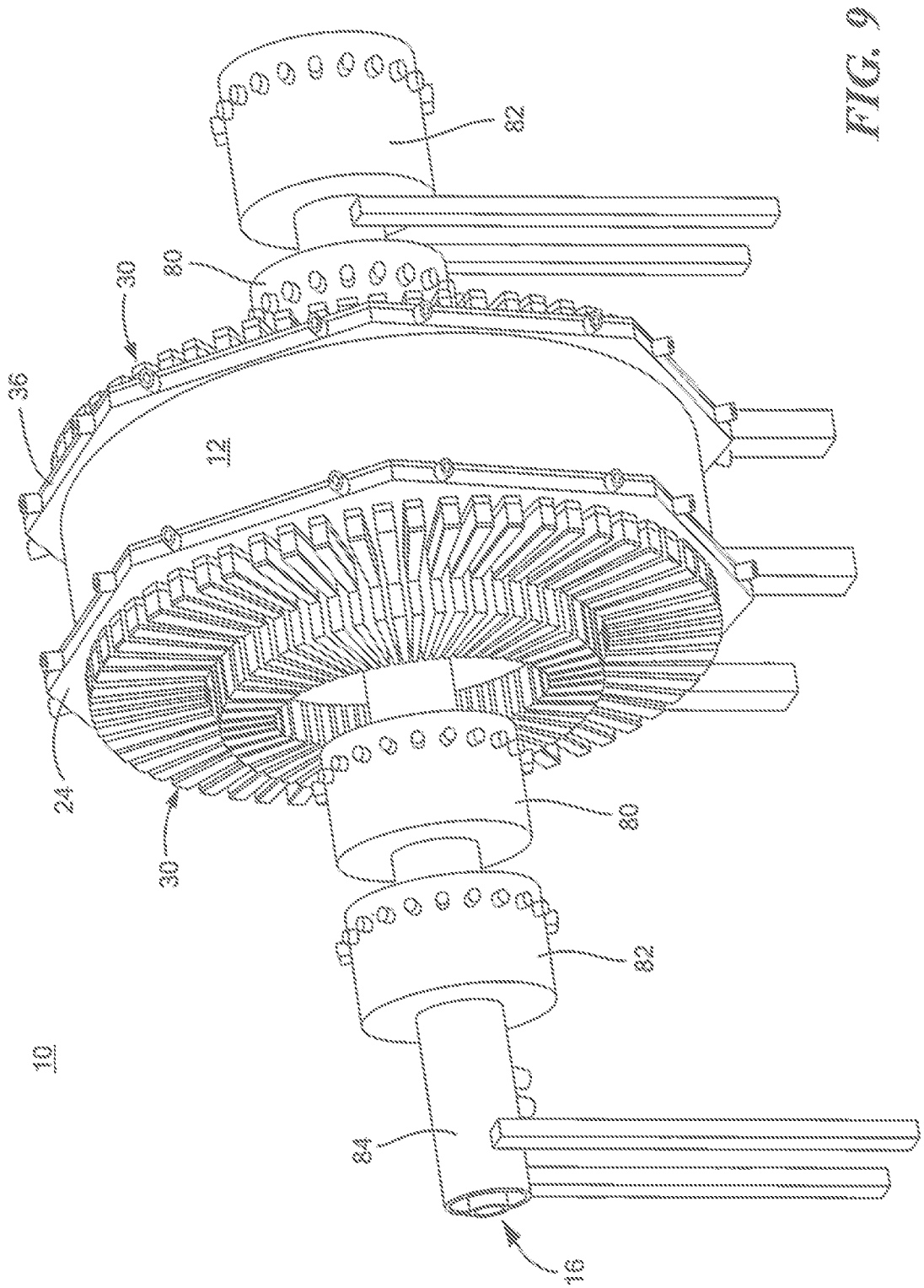
FIG. 9 shows an example of numerous tri-quad modules mounted on one or both sides of the resonant cavity to provide a total of about one hundred and twenty tri-quad modules.

In one example, a plurality of tri-quad modules 30 may be installed about every 6° around the periphery of end-plate 24, e.g., as shown in FIG. 2. In other examples, a plurality of tri-quad modules 30 may be preferably installed approximately every 6° around the periphery of end-plate 24 and/or end-plate 36, e.g., as shown in FIGS. 1 and 9. In one example of this design, the water-cooled end-plates 24, 36 are about 72-inch diameter and are made of copper to serve as efficient heat sinks with a minimum of cooling connections.

Figure 10:
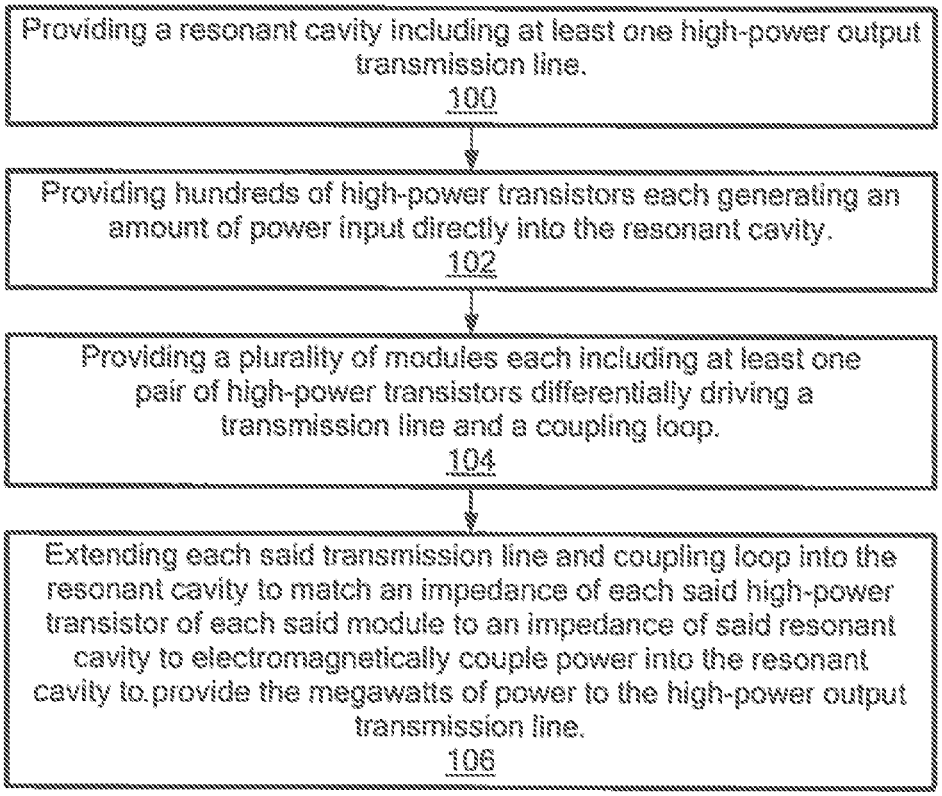
FIG. 10 is a block diagram showing the primary steps of one example of the method for providing megawatts of power with a solid-state direct cavity combiner (DCC) transmitter.

One example of the method for providing megawatts of power with a solid-state direct cavity combiner (DCC) transmitter includes providing a resonant cavity including at least one high-power output transmission line, step 100, FIG. 10. The method also includes providing hundreds of high-power transistors each generating an amount of power directly into the resonant cavity, step 102. The method also includes providing a plurality of modules each including at least one pair of high-power transistors differentially driving a transmission line and a coupling loop, step 104. The method also includes extending each transmission line and coupling loop into the resonant cavity to the match the impedance of each high-power transistor of each module to an impedance of the resonant cavity to electromagnetically couple power into the resonant cavity to provide megawatts of power to the high-power output transmission line, step 106.

Figure 11:
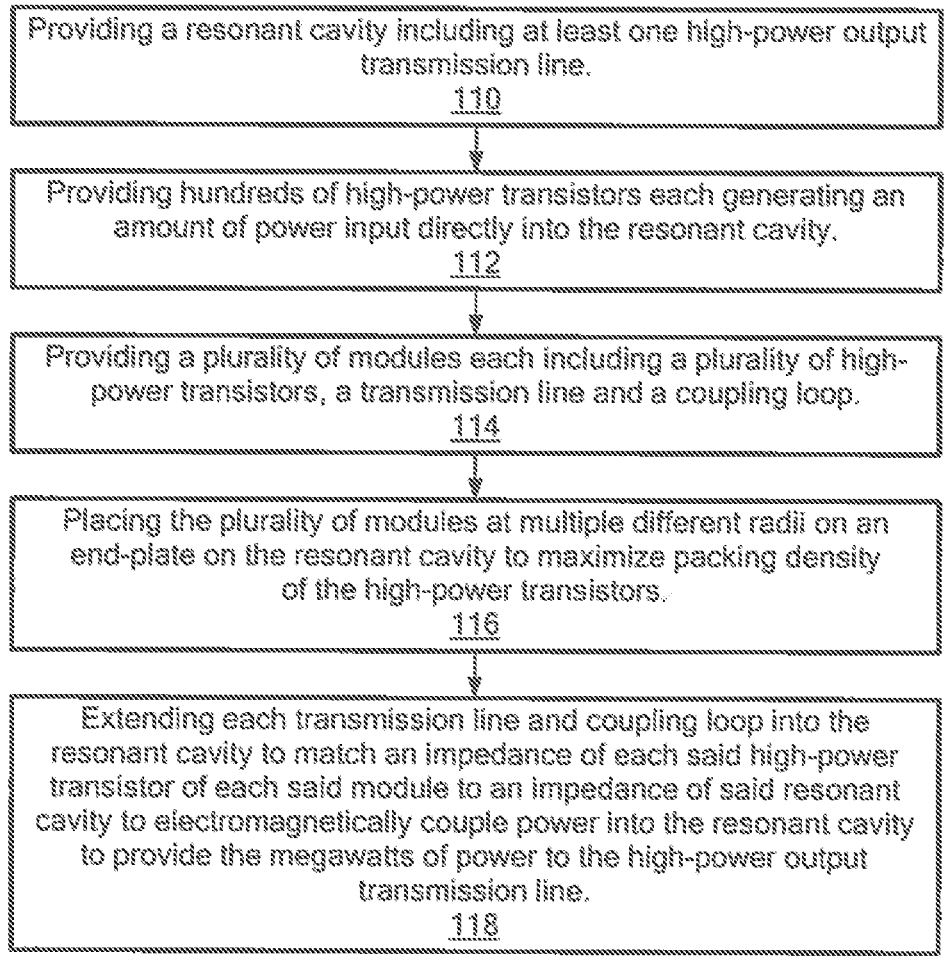
FIG. 11 is a block diagram showing the primary steps of another example of the method for providing megawatts of power with a solid-state direct cavity combiner (DCC) transmitter.

In another example, the method of providing megawatts of power with a solid-state DCC transmitter includes providing a resonant cavity including at least one high-power output transmission line, step 110, FIG. 11. The method also includes providing hundreds of high-power transistors each generating an amount of power input directly into the resonant cavity, step 112. The method also includes providing a plurality of modules each including a plurality of high-power transistors, a transmission line and a coupling loop, step 114. The method also includes placing the plurality of modules at multiple different radii on an end-plate on the resonant cavity to maximize packing density of the high-power transistors, step 116. The method also includes extending each transmission line and coupling loop into the resonant cavity to match an impedance of each high-power transistor of each module to an impedance of the resonant cavity to electromagnetically couple power into the resonant cavity to provide the megawatts of power to the high-power output transmission line, step 118.

Figure 12:
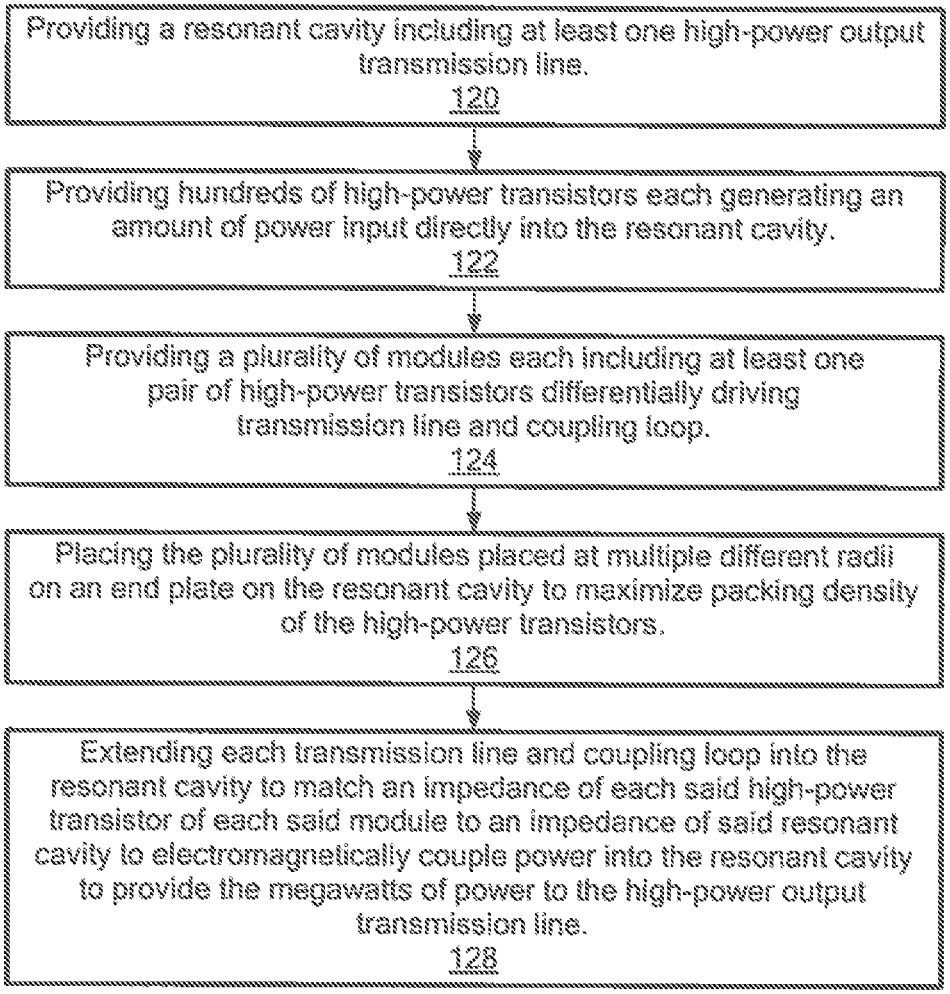
FIG. 12 is a block diagram showing the primary steps of another example of the method for providing megawatts of power with a solid-state direct cavity combiner (DCC) transmitter.

In yet another example, the method for providing megawatts of power with a solid-state DCC transmitter includes providing a resonant cavity including at least one high-power output transmission line, step 120, FIG. 12. The method also includes providing hundreds of high-power transistors each generating an amount of power input directly into the resonant cavity, step 122. The method also includes providing a plurality of modules each including at least one pair of high-power transistors differentially driving transmission line and a coupling loop, step 124. The method also includes placing the plurality of modules positioned at multiple different radii on an end-plate on the resonant cavity to maximize packing density of the high-power transistors, step 126. The method also includes extending each transmission line and coupling loop into the resonant cavity to match an impedance of each high-power transistor of each module to an impedance of the resonant cavity to electromagnetically couple power into the resonant cavity to provide the megawatts of power to the high-power output transmission line, step 128.

The result is solid-state DCC transmitter system 10, as discussed above in one example, preferably provides a total of about 1.3 MW of RF power when fully populated, e.g., about 120 tri-quad modules 60 per each end-plate 24, 36 multiplied by three quad modules 20 each having four high-power RF transistors each providing about 900 W. FIGS. 1 and 9 show an example of about 60 tri-quad modules 30 which each preferably provide about 10.8 kW of power mounted on end-plate 24 and about 60 tri-quad modules 30 mounted on end-plate 36 such that solid-state DCC transmitter system 10 may provide 1300 kW needed for commercial fusion reactors.

Resonant cavity 12 shown in one or more of FIGS. 1, 2, 3A, 3B, 4A, 4B, 5, 6, 7, 8 and 9 is preferably a linear device and operates similarly to a linear transformer: both are power-conserving devices (excepting minor losses) and superposition of magnetic and electric fields guarantees power output equal to power input. Thick conductive end-plates 24, 36, as discussed above, preferably have embedded water-cooling channels, exemplarily indicated at 40, FIGS. 1, 2, 4B and 5, that receive a cooling liquid for direct heat removal from high-power transistors 14. The cooled end-plates, e.g., end-plate 24 shown in greater detail in FIG. 5, preferably cool many of the high-power transistors 14 of each quad module 20 of each tri-quad module 30 as shown with a single cooled liquid input and output port 40. This design allows quad modules 20 to have only three connections each (drain power 60, gate bias voltage 58 and RF input 53) to operate, e.g., as shown in FIGS. 6 and 7. Only two connectors may be needed if bias supplied by bias voltage 58 is derived locally from the drain power. Solid-state DCC transmitter system 10 of one or more embodiments of this invention preferably requires minimal ancillary equipment beyond an RF driver module and an MVDC power supply.

Cooling may be provided by a single input, single output water connection via cooling ports 40 for the entire 1.3 MW system 10.

The inherent high-power density of the high-power transistors, transmission lines, and coupling loops of solid-state DCC transmitter system 10 preferably enables a very high-power density system which is cooled by water channels located immediately below the high-power RF transistors, as discussed above. The tuning of resonant cavity 12 and output control may be performed en masse to all of the plurality of high-power transistors 14 by use of an axially located adjustable tuning element and an axially located output coupler which interact with the magnetic and electric fields within cavity 12 to adjust the quality factor and resonant frequency of resonant cavity 12. This arrangement preferably eliminates the need to tune each individual transistor for the system operating conditions, making these functions straightforward and simple. This arrangement avoids one of the problems of conventional commercial distributed RF systems.

Solid-state DCC transmitter system 10 preferably provides an order of magnitude improvement in Mean Time Between Failures (MTBF) and Mean Time To Repair (MTTR), preferably provides an order of magnitude reduction in physical footprint, and preferably provides about a 50% reduction in the cost per watt compared to conventional tetrode-based systems. Solid-state DCC transmitter system 10 may provide power up to about 1.3 MW level per resonant cavity 12 required for practical commercial fusion reactors.

Solid-state DCC transmitter system 10 may be mass produced with conventional circuit fabrication techniques. The modular structure of the solid-state DCC transmitter system 10 discussed above may be a full-power transmitter with a partially populated, full-size prototype. The modular design of solid-state DCC transmitter system 10 enables scale-up in transmitter power, easy adaptation to a range of commercial fusion plant configurations and sizes, and low manufacturing costs due to cost scaling of the mass-produced RF modules.

Together, the advantages discussed above preferably enable affordable scaling of this technology to the multiple megawatts of RF power required for plasma heating in a realistic fusion system. Solid-state DCC transmitter system 10 of one or more embodiments of this invention may combine multiple resonant cavities 12, e.g., as disclosed in the applicant's '665 patent cited supra to increase the total available RF power to the needs of the specific fusion system.

Every major magnetic fusion system requires auxiliary means of heating the plasma to start the fusion reaction. ICRF heating is commonly used due to the efficiency thereof, steady-state nature, and compatibility with the fusion environment. ICRF applied to plasmas has shown increased plasma energy content, electron temperature and bulk ion heating. Heating plasmas with ICRF waves has been shown to be an effective method of heating present-day tokamak plasma and recent work has shown the potential to heat reactor plasmas. See, e.g., M J Mantsinen, et al, *Analysis of Bulk Ion Heating with ICRH in JET High-performance Plasmas*", preprint of paper Plasma Physics and Controlled Fusion, incorporated by reference herein.

To heat the fusion plasma, RF power in the range of 10 MW is required. A solid-state DCC transmitter comprised of one or more embodiments of this invention may produce RF power in the ICRF for approximately $1/W to $2/W which is much less than alternative solid-state approaches or conventional tetrode-based systems.

Solid-state DCC transmitter system 10 preferably provides a modular, low-cost, high-efficiency, high-power, highly reliable RF transmitter suitable for ICRF fusion plasma heating. The electrical, RF, and mechanical simplicity of the architecture discussed above with reference to one or more of FIGS. 1, 2, 3A, 3B, 4A, 4B, 5, 6, 7, 8, and 9 preferably enables low costs of less than $2/W, efficiencies well above 70%, total power per resonant cavity 12 of over 1.3 MW, with a MTBF of over 100,000 hours.

One of the primary challenges in fusion is achieving a hot dense plasma. RF heating of fusion plasmas requires producing and controlling MWs of cost-effective RF power. Tetrodes are not viable for commercial fusion power, and competing Solid-State Amplifiers (SSAs), have a multitude of independent mechanical joints, binary combiners, impedance matching stages, and water coolant connections. Solid-state DCC transmitter system 10 of one or more embodiments of this invention uses a direct-connection approach, which reduces costs by significantly simplifying the electrical, thermal, and mechanical design and also dramatically improves reliability and ease of maintenance.

ICRF power is considered a good candidate to efficiently heat plasmas to thermonuclear conditions for future devices like the International Tokamak Experimental Reactor (ITER) and the Small Prototype Advanced Robust Compact Reactor (SPARC) has favorable scaling to reactor plasmas without core wave penetration issues. The core wave physics has been experimentally established including deuterium-tritium discharges in the Tokamak Fusion Test Reactor (TFTR) and the Joint European Tokamak (JET). These studies demonstrated that the majority of the power is absorbed by fuel ions via second harmonic tritium with co-resonant minority 3He absorption providing a path to a burning plasma regime. The ability to preferentially heat bulk ion, minority ions or electrons by an appropriate choice of the launched frequency and spectrum is potentially advantageous. This flexibility can be exploited to provide an effective means of central density and impurity control. Recent experiments in the Axially Symmetric Divertor Experiment Upgrade (ASDEX-U) and Alcator C-Modu have shown that high-power ICRF power being coupled into plasmas with minimal impurity contamination. Successful long pulse ICRF heating experiments show that ICRF heating technology can be used to reach burning plasma conditions.

Transmitter reliability is preferably increased by an order of magnitude or more with a solid-state RF amplifier, such as solid-state DCC transmitter system 10 of one or more embodiments of this invention when compared to tetrodes. Not only are individual RF transistors longer-lived, but the failure of an individual module has a small impact on the overall operation of the amplifier; the impact being a slight reduction in output power. This graceful degradation means that full power operation can be maintained even in the event of failure of a number of modules.

An RF plant utilizing solid-state DCC transmitter system 10 would have a dramatically longer MTBF and reduced support costs, lowering the Life Cycle Cost (LCC) by more than about 50%. It is estimated that solid-state DCC transmitter system 10 will reduce the expected plant lifetime RF cost, including tube repair/replacements from about $4/W down to about $2.00/W, significantly increasing the competitiveness and feasibility of fusion power in general, and of high-field tokamaks in particular. One or more embodiments of solid-state DCC transmitter system 10 preferably enables smaller fusion plants by reducing the recirculating power, which essentially reduces a parasitic loss. 30 MW of recirculating power in a giga watt (GW)-class machine is negligible, but in a 100 MW plant, the RF is consuming 30% of the plant output just to keep the plasma going. The LCC comparison is even more favorable due to the improved efficiency of solid-state DCC transmitter system 10. Solid-state DCC transmitter system 10 will preferably allow commercial fusion energy to meet the operational expectations of future utility customers.

The ability of solid-state DCC transmitter system 10 to provide reliable, affordable, plasma heating technology makes the overall fusion system less expensive and simpler to operate reliably.

Direct mounting of the modules 20 on water-cooled end-plates 24 and 36 discussed above with reference to one or more of FIGS. 1, 2, 3A, 3B, 4A, 4B, 5, 6, 7, 8 and 9 preferably maximizes heat transfer from high-power transistors 14 to the internal flow channels in end-plates of large resonant cavity 12 while minimizing the number of required cooling connections 40. This arrangement preferably allows greater power density due to the ability to the elimination of cooling connections on the modules (enabling them to be smaller) and dramatically simplified maintenance requirements. Solid-state DCC transmitter system 10 provides high transmitter reliability preferably provided by graceful degradation which results because each magnetic coupling loop 28, FIGS. 3A, 5, and 7 has an area that is small compared to resonant cavity 12. Thus, even if several individual transistors fail, the effect of several individual transistors failing effects only weakly couple to the cavity field and do not disrupt the operation of solid-state DCC transmitter system 10. The addition of more transistors than nominally required allows full specification performance despite any failures. Solid-state DCC transmitter system 10 preferably includes fast-acting DC and RF FET drain over-voltage protection on each quad module 20 of each of tri-quad module 30 which also reduces risk during operation with the inevitable plasma mismatches. Grouping the high-power RF transistors 14 into tri-quad-modules 30 enables increased RF power density and simplified economical distribution of DC power.

Each quad module 20, FIG. 3A, may also preferably include a fuse configured to isolate a shorted drain from the rest of the quad modules 20. In one example, the fuse may be at the 50 V drain voltage or at the 600 VDC input to the tri-quad module down converter 32. Future transistors may operate at higher voltages, e.g., 100 VDC to 600 VDC, and may not need local buck converters.

Solid-state DCC transmitter system 10 preferably provides an approach to solid-state RF combination which is highly effective because the solid-state DCC transmitter system 10 allows the outputs from a large number of modules to be combined in a single step with minimal coupling between modules. The available power output of solid-state DCC transmitter system 10 of one or more embodiments of this invention is constrained only by the number of modules which fit on end-plates 24, 36, shown in one or more of FIGS. 1, 2, 3A, 3B, 4A, 4B, 5, 6, 7, 8, and 9.

The result is solid-state DCC transmitter system 10 discussed above preferably provides one or more of the following key attributes which differentiate solid-state DCC transmitter system 10 from other amplifiers: low cost at MW power levels, high RF reliability and availability, electrical, RF, and mechanical simplicity and robustness, high efficiency operation, and small footprint due to high-power density of tri-quad modules.

Solid-state DCC transmitter system 10 preferably includes resonant cavity 12 that functions electrically as both a power combiner and also as an integral part of the transistor output matching network. Low output impedance high-power RF transistors 14 are not matched up to an arbitrary 50-ohm impedance level. Instead, solid-state DCC transmitter system 10 includes magnetic coupling loops that operate at the optimum load impedance at the drain of the devices. This configuration is simple and has low losses.

The resonant cavity is a well-known means of combining or dividing power. Typically, a resonant cavity has a high unloaded Q, so that intrinsic losses can be very low. With heavy input and output loading, the loaded Q is much lower, providing good bandwidth, e.g., about 10%, while retaining the intrinsic low conduction losses of the cavity. Resonant cavity 12 of solid-state DCC transmitter system 10 preferably provides a large, well-defined electromagnetic field structure which can be driven simultaneously by many transistors. Various geometry and mode combinations for resonant cavity 12 may utilized.

The ability of resonant cavity 12 to accommodate additional high-power RF transistors without significantly changing the interior magnetic or electric fields by increasing the output coupling allows nearly linear increases in power per transistor and simplifies each power output stage. The combination of many inputs into a single resonant cavity 12 provides a high degree of redundancy and a graceful degradation characteristic.

Resonant cavity 12 has a very high unloaded Q factor, enabling power to be resonated out of individual amplifiers with nearly zero loss. The Q factor drops as the resonant cavity 12 is more heavily loaded and driven, enabling multiple transistors to drive resonant cavity 12 with minimal inter-module interactions. Both the resonant frequency and the loading of resonant cavity 12 of solid-state DCC transmitter system 10 are preferably easily adjustable with capacitive tuning slugs, e.g., as disclosed in the '665 patent cited supra. This allows for easy addition of tri-quad modules 22 without significantly altering the internal field structure. The stability of the internal fields provides exceptional isolation; individual module failures do not destabilize the resonant cavity 12 enough to bring the solid-state DCC transmitter system 10 down and the remaining modules merely operate at slightly reduced power. Several simulations were run in Keysight Advanced Design System (ADS) and EMPro® to establish the cavity properties under load.

Based on analytical calculations and theoretical results, the applicant has fabricated several prototype 650 MHz solid-state DCC transmitter system RF modules and has tested such prototype modules in a 650 MHz resonant cavity 12 which demonstrated multiple modules combining at 2.25 kW output RF power per module, e.g., as shown in one or more of FIGS. 1, 2, 3A, 3B, 4A, 4B and 5-12 and also disclosed in the '665 patent cited supra.

The greatest risks of one or more embodiments solid-state DCC transmitter system 10 of this invention may be the parasitic effects of the extreme parameter space in this highly engineered system. Solid-state DCC transmitter system 10 may be characterized by very high-power, very high-power density, and very large mechanical dynamic range (ratio of component size to dimensional tolerance). Parasitic effects occurring in electrical, RF, thermal, and mechanical domains are preferably controlled by one or more embodiments of solid-state DCC transmitter system 10 to ensure proper operation thereof.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art.

What is claimed is:

1. A solid-state direct cavity combiner (DCC) transmitter system for providing megawatts of power, the system comprising:
   a resonant cavity including at least one high-power output transmission line;
   hundreds of high-power transistors, each transistor generating an amount of power input directly into the resonant cavity;
   a plurality of modules, each module including at least one pair of high-power transistors of the hundreds of high-power transistors differentially driving a transmission line and a coupling loop; and
   each said transmission line and coupling loop extending into the resonant cavity such as to match an impedance of each said high-power transistor of each said module to an impedance of said resonant cavity to electromagnetically couple power into the resonant cavity to thereby provide the megawatts of power to the at least one high-power output transmission line.

2. The system of claim 1 in which the megawatts of power is in the range of about 1 MW to about 3 MW.

3. The system of claim 1 in which each module includes the transmission line, the coupling loop, and the at least one pair of high-power transistors.

4. The system of claim 3 in which the at least one pair of high-power transistors are symmetrically opposed to provide differential inputs to the transmission line.

5. The system of claim 3 in which each module includes two pairs of high-power transistors of the hundreds of high-power transistors packaged as a quad module.

6. The system of claim 5 in which each pair of high-power transistors are symmetrically opposed to provide differential inputs to each transmission line.

7. The system of claim 5 in which the plurality of modules further include a plurality of quad modules, the quad modules positioned proximate one or more concentric rings about an end plate of the cavity.

8. The system of claim 5 in which each quad module is positioned at a different radius on an end-plate.

9. The system of claim 7 in which a plurality of tri-quad modules are positioned equally space along the concentric rings about the end-plate.

10. The system of claim 3 in which the plurality of modules are positioned on the resonant cavity to maximize packing density of the hundreds of high-power transistors.

11. The system of claim 10 in which three quad modules of the plurality of modules are packaged as a tri-quad module.

12. The system of claim 11 in which each tri-quad module includes a power converter to efficiently power the hundreds of high-power transistors from a single high-voltage input.

13. The system of claim 11 in which each of the tri-quad modules are positioned on the resonant cavity to maximize packing density of the hundreds of high-power transistors.

14. The system of claim 10 in which the plurality of modules are positioned at different radii on an end-plate on the resonant cavity.

15. The system of claim 1 in which the resonant cavity includes at least one liquid cooled cavity end-plate including a plurality of coolant channels.

16. The system of claim 1 in which a predetermined number of the plurality of modules are positioned proximate one or more concentric rings about an end plate of the cavity.

17. The system of claim 1 in which the resonant cavity includes a plurality of concentric rings of slots disposed through an end-plate.

18. The system of claim 17 in which each said transmission line and said coupling loop of each said module extend through a corresponding slot of the plurality of concentric rings of slots.

19. The system of claim 1 in which the megawatts of power may be used for plasma heating in a fusion reactor.

20. The system of claim 1 in which each of the plurality of modules includes an electrostatic shield mounted to an interior of the resonant cavity to shield each coupling loop from an axial electric field.

21. The system of claim 1 in which each of the plurality of modules includes an overvoltage protection circuit configured to prevent damage to the hundreds of high-power transistors in the event of an overload.

22. A solid-state direct cavity combiner (DCC) transmitter system for providing megawatts of power, the system comprising:
   a resonant cavity including at least one high-power output transmission line;
   hundreds of high-power transistors, each transistor generating an amount of power input directly into the resonant cavity;
   a plurality of modules, each module including a plurality of high-power transistors of the hundreds of high-power transistors, a transmission line and a coupling loop; and
   the plurality of modules is positioned at multiple different radii on an end-plate on the resonant cavity such as to maximize packing density of the hundreds of high-power transistors, each transmission line and coupling loop extending into the resonant cavity such as to match an impedance of each said high-power transistor of each said module to an impedance of said resonant cavity to electromagnetically couple power into the resonant cavity to thereby provide the megawatts of power to the at least one high-power output transmission line.

23. The system of claim 22 in which the megawatts of power is in the range of about 1 MW to about 3 MW.

24. The system of claim 22 in which each module includes the transmission line, the coupling loop, and at least one pair of high-power transistors of the hundreds of high-power transistors.

25. The system of claim 24 in which at least one pair of high-power transistors of the hundreds of high-power transistors are symmetrically opposed to provide differential inputs to the transmission line.

26. The system of claim 24 in which each module includes two pairs of high-power transistors packaged as a quad module.

27. The system of claim 26 in which each pair of high-power transistors are symmetrically opposed to provide differential inputs to each transmission line.

28. The system of claim 26 in which a plurality of the quad modules is positioned proximate one or more concentric rings about the end-plate.

29. The system of claim 26 in which each quad module is positioned at a different radius on the end-plate.

30. The system of claim 26 in which three quad modules of the plurality of modules are packaged as a tri-quad module.

31. The system of claim 30 in which a plurality of the tri-quad modules are positioned equally spaced along one or more concentric rings about the end-plate.

32. The system of claim 30 in which each of the tri-quad modules are positioned on the resonant cavity to maximize packing density of the hundreds of high-power transistors.

33. The system of claim 30 in which each tri-quad module includes a power converter to efficiently power the hundreds of high-power transistors from a single high-voltage input.

34. The system of claim 22 in which the resonant cavity includes at least one liquid cooled cavity end-plate including a plurality of coolant channels.

35. The system of claim 22 in which the resonant cavity includes a plurality of concentric rings of slots disposed through the end-plate.

36. The system of claim 35 in which each said transmission line and said coupling loop of each said module extend through a corresponding slot of the plurality of concentric rings of slots.

37. The system of claim 22 in which a predetermined number of the plurality of modules are positioned proximate one or more concentric rings about the end-plate.

38. The system of claim 22 in which each of the plurality of modules includes an electrostatic shield mounted to an interior of the resonant cavity to shield each coupling loop from an axial electric field.

39. The system of claim 22 in which each of the plurality of modules includes an overvoltage protection circuit configured to prevent damage to the hundreds of high-power transistors in the event of an overload.

40. The system of claim 22 in which the megawatts of power may be used for plasma heating in a fusion reactor.

41. A solid-state direct cavity combiner (DCC) transmitter system for providing megawatts of power, the system comprising:
a resonant cavity including at least one high-power output transmission line;
hundreds of high-power transistors, each transistor generating an amount of power input directly into the resonant cavity;
a plurality of modules, each module including at least one pair of high-power transistors of the hundreds of high-power transistors differentially driving a transmission line and a coupling loop;
the plurality of modules positioned at multiple different radii on an end-plate on the resonant cavity to maximize packing density of the hundreds of high-power transistors, and
each transmission line and coupling loop extending into the resonant cavity such as to match an impedance of each said high-power transistor of each said module to an impedance of said resonant cavity to electromagnetically couple power into the resonant cavity to thereby provide the megawatts of power to the at least one high-power output transmission line.

42. The system of claim 41 in which each of the plurality of modules include an electrostatic shield mounted to an interior of the resonant cavity to shield each coupling loop from an axial electric field.

43. The system of claim 41 in which each of the plurality of modules includes an overvoltage protection circuit configured to prevent damage to the hundreds of high-power transistors in the event of an overload.

44. The system of claim 41 in which the megawatts of power is in the range of about 1 MW to about 3 MW.

45. The system of claim 41 in which each module includes the transmission line, the coupling loop, and at least one pair of high-power transistors of the hundreds of high-power transistors.

46. The system of claim 45 in which at least one pair of high-power transistors of the hundreds of high-power transistors are symmetrically opposed to provide differential inputs to the transmission line.

47. The system of claim 45 in which each pair of high-power transistors are symmetrically opposed to provide differential inputs to each transmission line.

48. The system of claim 45 in which each module includes two pairs of high-power transistors packaged as a quad module.

49. The system of claim 48 in which a plurality of the quad modules is positioned proximate one or more concentric rings about the end-plate.

50. The system of claim 48 in which each quad module is positioned at a different radius on the end-plate.

51. The system of claim 48 in which three quad modules of the plurality of modules are packaged as a tri-quad module.

52. The system of claim 51 in which each tri-quad module incorporates a power converter to efficiently power the hundreds of high-power transistors from a single high-voltage input.

53. The system of claim 51 in which the plurality of tri-quad modules are positioned equally spaced along one or more concentric rings about the end-plate.

54. The system of claim 51 in which each of the tri-quad modules are positioned on the resonant cavity to maximize packing density of the hundreds of high-power transistors.

55. The system of claim 41 in which the end-plate includes at least one liquid cooled cavity including a plurality of coolant channels.

56. The system of claim 41 in which the end-plate includes a plurality of concentric rings of slots through an end-plate.

57. The system of claim 56 in which each said transmission line and said coupling loop of each said module extend through a corresponding slot of the plurality of concentric rings of slots.

58. The system of claim 41 in which a predetermined number of the plurality of modules are positioned proximate one or more concentric rings about the end-plate.

59. The system of claim 41 in which the megawatts of power may be used for plasma heating in a fusion reactor.

60. A method for providing megawatts of power with a solid-state direct cavity combiner (DCC) transmitter, the method comprising:
   providing a resonant cavity including at least one high-power output transmission line;
   providing hundreds of high-power transistors, each transistor generating an amount of power input directly into the resonant cavity;
   providing a plurality of modules, each module including at least one pair of high-power transistors of the hundreds of high-power transistors differentially driving a transmission line and a coupling loop; and
   extending each said transmission line and coupling loop into the resonant cavity such as to match an impedance of each said high-power transistor of each said module to an impedance of said resonant cavity to electromagnetically couple power into the resonant cavity to thereby provide the megawatts of power to the at least one high-power output transmission line.

61. A method for providing megawatts of power with a solid-state direct cavity combiner (DCC) transmitter, the method comprising:
   providing a resonant cavity including at least one high-power output transmission line;
   providing hundreds of high-power transistors, each transistor generating an amount of power input directly into the resonant cavity;
   providing a plurality of modules, each module including a plurality of high-power transistors of the hundreds of high-power transistors, a transmission line and a coupling loop; and
   placing the plurality of modules at multiple different radii on an end-plate on the resonant cavity to maximize packing density of the hundreds of high-power transistors, and
   extending each transmission line and coupling loop into the resonant cavity such as to match an impedance of each said high-power transistor of each said module to an impedance of said resonant cavity to electromagnetically couple power into the resonant cavity to thereby provide the megawatts of power to the at least one high-power output transmission line.

62. A method for providing megawatts of power with a solid-state direct cavity combiner (DCC) transmitter, the method comprising:
   providing a resonant cavity including at least one high-power output transmission line;
   providing hundreds of high-power transistors, each transistor generating an amount of power input directly into the resonant cavity;
   providing a plurality of modules, each module including at least one pair of high-power transistors of the hundreds of high-power transistors differentially driving transmission line and a coupling loop; and
   placing the plurality of modules positioned at multiple different radii on an end-plate on the resonant cavity to maximize packing density of the hundreds of high-power transistors, and
   extending each transmission line and coupling loop into the resonant cavity such as to match an impedance of each said high-power transistor of each said module to an impedance of said resonant cavity to electromagnetically couple power into the resonant cavity to thereby provide the megawatts of power to the at least one high-power output transmission line.

* * * * *